US012672576B2

(12) United States Patent
Yang et al.

(10) Patent No.: US 12,672,576 B2
(45) Date of Patent: Jun. 30, 2026

(54) SEMICONDUCTOR STRUCTURE AND MANUFACTURING METHOD THEREOF

(71) Applicant: United Microelectronics Corp., Hsinchu (TW)

(72) Inventors: Chin-Chia Yang, Tainan City (TW); Da-Jun Lin, Kaohsiung City (TW); Fu-Yu Tsai, Tainan City (TW); Bin-Siang Tsai, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 555 days.

(21) Appl. No.: 17/735,126

(22) Filed: May 3, 2022

(65) Prior Publication Data

US 2023/0361067 A1 Nov. 9, 2023

(51) Int. Cl.
*H10W 72/00* (2026.01)
*H10W 72/90* (2026.01)
*H10W 99/00* (2026.01)
*H10W 80/00* (2026.01)
*H10W 90/00* (2026.01)

(52) U.S. Cl.
CPC .......... *H10W 72/90* (2026.01); *H10W 99/00* (2026.01); *H10W 80/312* (2026.01); *H10W 80/327* (2026.01); *H10W 90/792* (2026.01)

(58) Field of Classification Search
CPC . H01L 2224/08145; H01L 2224/08147; H01L 2224/80896; H01L 2224/08167

USPC .......................................................... 257/767
See application file for complete search history.

(56) References Cited

U.S. PATENT DOCUMENTS

| | | | |
|---|---|---|---|
| 6,962,835 B2 * | 11/2005 | Tong ...................... | B23K 20/02 |
| | | | 257/E21.705 |
| 7,728,433 B2 * | 6/2010 | Cui ................... | H01L 21/76834 |
| | | | 257/762 |
| 8,486,587 B2 | 7/2013 | Tsai et al. | |
| 8,697,493 B2 * | 4/2014 | Sadaka ................... | H01L 24/80 |
| | | | 438/455 |
| 9,142,517 B2 | 9/2015 | Liu et al. | |
| 9,275,933 B2 | 3/2016 | Kuo et al. | |
| 9,461,007 B2 * | 10/2016 | Chun ................ | H01L 23/53238 |
| 9,496,154 B2 * | 11/2016 | Tosaya ................... | H01L 24/91 |
| 9,748,139 B1 | 8/2017 | Liou et al. | |
| 9,761,791 B2 | 9/2017 | Shiu et al. | |
| 9,960,129 B2 | 5/2018 | Liu et al. | |
| 10,090,465 B2 | 10/2018 | Hsu et al. | |
| 10,157,889 B2 | 12/2018 | Chen et al. | |
| 10,727,205 B2 | 7/2020 | Wu et al. | |
| 11,205,619 B2 | 12/2021 | Wang et al. | |
| 2013/0320556 A1 * | 12/2013 | Liu ......................... | H01L 24/92 |
| | | | 438/455 |

(Continued)

*Primary Examiner* — Trang Q Tran
(74) *Attorney, Agent, or Firm* — JCIPRNET

(57) ABSTRACT

A semiconductor structure including a first substrate, a first dielectric layer, a first oxygen doped carbide (ODC) bonding layer, a second substrate, a second dielectric layer, and a second ODC bonding layer is provided. The first dielectric layer is located on the first substrate. The first ODC bonding layer is located on the first dielectric layer. The second dielectric layer is located on the second substrate. The second ODC bonding layer is located on the second dielectric layer. The first ODC bonding layer and the second ODC bonding layer are bonded to each other.

9 Claims, 6 Drawing Sheets

(56)  References Cited

U.S. PATENT DOCUMENTS

2016/0141249 A1*  5/2016  Kang ................. H01L 25/0657
                                                     257/751
2020/0235063 A1*  7/2020  Chen ...................... H01L 25/50

* cited by examiner

SEMICONDUCTOR STRUCTURE AND MANUFACTURING METHOD THEREOF

BACKGROUND OF THE INVENTION

Field of the Invention

The invention relates to a semiconductor structure and a manufacturing method thereof, and particularly relates to a semiconductor structure having an oxygen doped carbide (ODC) bonding layer and a manufacturing method thereof.

Description of Related Art

In the bonding process, when an ultra low dielectric constant (ultra low-k or ULK) material is used as the material of the bonding layer, since the ultra low-k material is difficult to produce dangling bonds and has low mechanical strength, the bonding strength of the ultra low-k material is low. In addition, when silicon oxide is used as the material of the bonding layer, since the surface roughness of silicon oxide is high, silicon oxide is not suitable as the bonding material.

Furthermore, since the nitrogen doped carbide (NDC) material tends to produce dangling bonds and has lower surface roughness, using the NDC material for bonding can produce higher bonding strength. However, since the NDC material has higher dielectric constant, the NDC material is prone to cause resistance-capacitance (RC) delay.

SUMMARY OF THE INVENTION

The invention provides a semiconductor structure and a manufacturing method thereof, which can produce higher bonding strength and can reduce RC delay.

The invention provides a semiconductor structure, which includes a first substrate, a first dielectric layer, a first oxygen doped carbide (ODC) bonding layer, a second substrate, a second dielectric layer, and a second ODC bonding layer. The first dielectric layer is located on the first substrate. The first ODC bonding layer is located on the first dielectric layer. The second dielectric layer is located on the second substrate. The second ODC bonding layer is located on the second dielectric layer. The first ODC bonding layer and the second ODC bonding layer are bonded to each other.

According to an embodiment of the invention, in the semiconductor structure, the material of the first ODC bonding layer is, for example, silicon oxycarbide (SiCO).

According to an embodiment of the invention, in the semiconductor structure, the material of the second ODC bonding layer is, for example, silicon oxycarbide (SiCO).

According to an embodiment of the invention, the semiconductor structure may further include a first bonding pad and a second bonding pad. The first bonding pad is located in the first ODC bonding layer. The second bonding pad is located in the second ODC bonding layer.

According to an embodiment of the invention, in the semiconductor structure, the first bonding pad and the second bonding pad may be bonded to each other.

According to an embodiment of the invention, in the semiconductor structure, the first bonding pad may be further located in the first dielectric layer. The second bonding pad may be further located in the second dielectric layer.

According to an embodiment of the invention, in the semiconductor structure, the material of the first dielectric layer is, for example, silicon oxide (SiO), silicon nitride (SiN), silicon carbonitride (SiCN), silicon oxynitride (SiON), or a combination thereof.

According to an embodiment of the invention, in the semiconductor structure, the material of the second dielectric layer is, for example, silicon oxide (SiO), silicon nitride (SiN), silicon carbonitride (SiCN), silicon oxynitride (SiON), or a combination thereof.

According to an embodiment of the invention, in the semiconductor structure, the first substrate may be a substrate of a wafer or a substrate of a chip.

According to an embodiment of the invention, in the semiconductor structure, the second substrate may be a substrate of a wafer or a substrate of a chip.

The invention provides a manufacturing method of a semiconductor structure, which includes the following steps. A first substrate, a first dielectric layer, and a first ODC bonding layer are provided. The first dielectric layer is located on the first substrate. The first ODC bonding layer is located on the first dielectric layer. A second substrate, a second dielectric layer, and a second ODC bonding layer are provided. The second dielectric layer is located on the second substrate. The second ODC bonding layer is located on the second dielectric layer. The first ODC bonding layer and the second ODC bonding layer are bonded.

According to an embodiment of the invention, the manufacturing method of the semiconductor structure may further include the following steps. A first bonding pad is formed in the first ODC bonding layer. A second bonding pad is formed in the second ODC bonding layer.

According to an embodiment of the invention, the manufacturing method of the semiconductor structure may further include the following steps. The first bonding pad and the second bonding pad are bonded.

According to an embodiment of the invention, in the manufacturing method of the semiconductor structure, the method of bonding the first ODC bonding layer and the second ODC bonding layer and bonding the first bonding pad and the second bonding pad is, for example, a hybrid bonding method.

According to an embodiment of the invention, in the manufacturing method of the semiconductor structure, the method of forming the first bonding pad may include the following steps. A passivation layer is formed on the first ODC bonding layer. An opening is formed in the passivation layer and the first ODC bonding layer. A bonding pad material layer is formed in the opening. A portion of the bonding pad material layer outside the opening is removed and the passivation layer is removed.

According to an embodiment of the invention, in the manufacturing method of the semiconductor structure, the method of forming the second bonding pad may include the following steps. A passivation layer is formed on the second ODC bonding layer. An opening is formed in the passivation layer and the second ODC bonding layer. A bonding pad material layer is formed in the opening. A portion of the bonding pad material layer outside the opening is removed and the passivation layer is removed.

According to an embodiment of the invention, the manufacturing method of the semiconductor structure may further include the following steps. Before the first ODC bonding layer and the second ODC bonding layer are bonded, a plasma treatment is performed on the first ODC bonding layer.

According to an embodiment of the invention, the manufacturing method of the semiconductor structure may further include the following steps. Before the first ODC bonding layer and the second ODC bonding layer are bonded, a plasma treatment is performed on the second ODC bonding layer.

According to an embodiment of the invention, in the manufacturing method of the semiconductor structure, the material of the first ODC bonding layer is, for example, silicon oxycarbide (SiCO).

According to an embodiment of the invention, in the manufacturing method of the semiconductor structure, the material of the second ODC bonding layer is, for example, silicon oxycarbide (SiCO).

Based on the above description, in the semiconductor structure and the manufacturing method thereof according to the invention, the first ODC bonding layer and the second ODC bonding layer are bonded to each other. In addition, the first ODC bonding layer and the second ODC bonding layer have lower surface roughness. Furthermore, the first ODC bonding layer and the second ODC bonding layer can produce more dangling bonds than the NDC bonding layer. Moreover, the first ODC bonding layer and the second ODC bonding layer have a lower dielectric constant than the NDC bonding layer. Therefore, bonding the first ODC bonding layer and the second ODC bonding layer can produce higher bonding strength and can reduce RC delay.

In order to make the aforementioned and other objects, features and advantages of the invention comprehensible, several exemplary embodiments accompanied with FIGURES are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1K are cross-sectional views illustrating a manufacturing process of a semiconductor structure according to an embodiment of the invention.

Figure 1A:
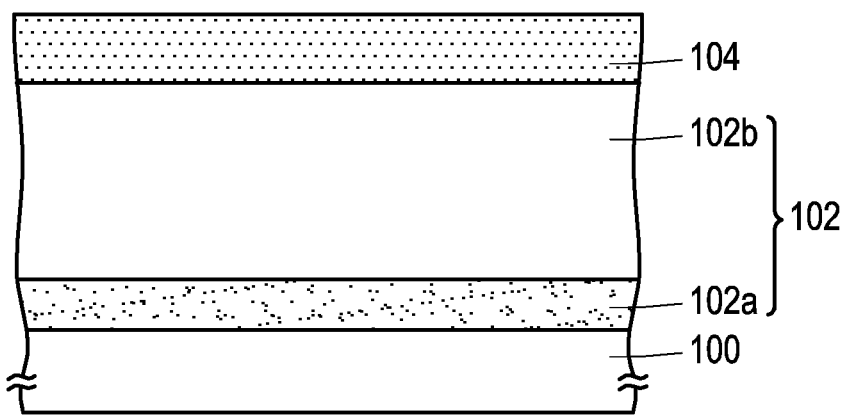
FIG. 1A to FIG. 1K are cross-sectional views illustrating a manufacturing process of a semiconductor structure according to an embodiment of the invention.

Referring to FIG. 1A, a substrate 100, a dielectric layer 102, and an oxygen doped carbide (ODC) bonding layer 104 are provided. The substrate 100 may be a semiconductor substrate such as a silicon substrate. Furthermore, although not shown in FIG. 1A, the required semiconductor device (e.g., active device and/or passive device), another required dielectric layer and/or the required interconnect structure may be located on the substrate 100, and the description thereof is omitted here.

The dielectric layer 102 is located on the substrate 100. The dielectric layer 102 may be a single-layer structure or a multilayer structure. The material of the dielectric layer 102 is, for example, silicon oxide (SiO), silicon nitride (SiN), silicon carbonitride (SiCN), silicon oxynitride (SiON), or a combination thereof. The method of forming the dielectric layer 102 is, for example, a chemical vapor deposition (CVD) method. In the present embodiment, the dielectric layer 102 may be a multilayer structure. For example, the dielectric layer 102 may include a dielectric layer 102a and a dielectric layer 102b, but the invention is not limited thereto. The dielectric layer 102a is located on the substrate 100. The material of the dielectric layer 102a is, for example, a nitrogen doped carbide (NDC) material (e.g., SiCN). The dielectric layer 102b is located on the dielectric layer 102a. The material of the dielectric layer 102b is, for example, silicon oxide (e.g., tetraethyl orthosilicate (TEOS) silicon oxide). In some embodiments, a chemical mechanical polishing (CMP) process may be performed on the dielectric layer 102b.

The ODC bonding layer 104 is located on the dielectric layer 102. The material of the ODC bonding layer 104 is, for example, silicon oxycarbide (SiCO). The method of forming the ODC bonding layer 104 is, for example, a CVD method.

Figure 1B:
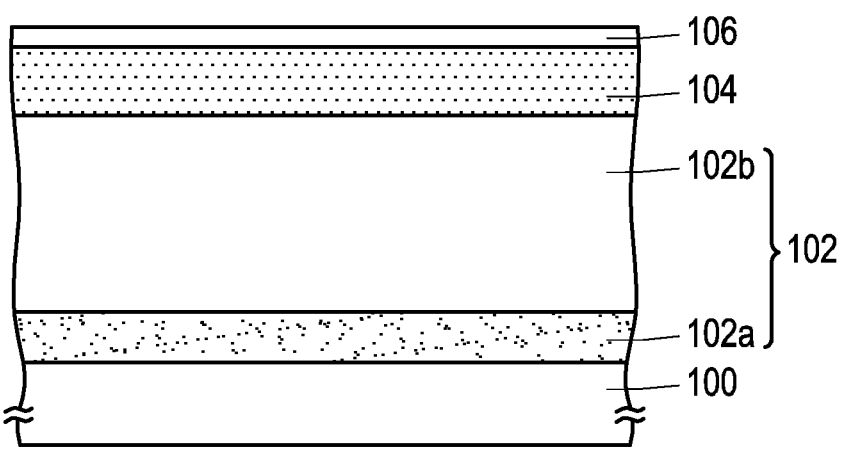

Referring to FIG. 1B, a passivation layer 106 may be formed on the ODC bonding layer 104. The material of the passivation layer 106 is, for example, silicon oxynitride (SiON). The method of forming passivation layer 106 is, for example, a CVD method.

Figure 1C:
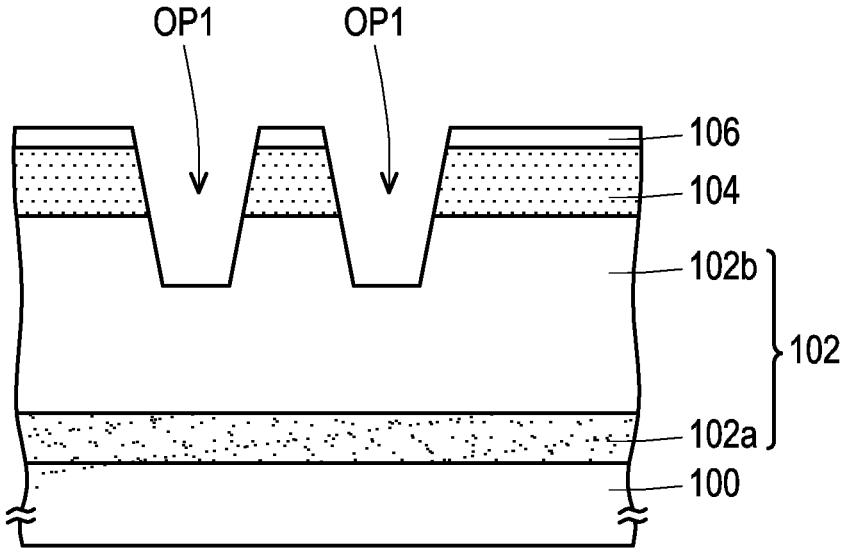

Referring to FIG. 1C, an opening OP1 may be formed in the passivation layer 106 and the ODC bonding layer 104. In some embodiments, the opening OP1 may be further formed in the dielectric layer 102. In some embodiments, the opening OP1 may be formed by patterning the passivation layer 106, the ODC bonding layer 104, and the dielectric layer 102 by a lithography process and an etching process.

Figure 1D:
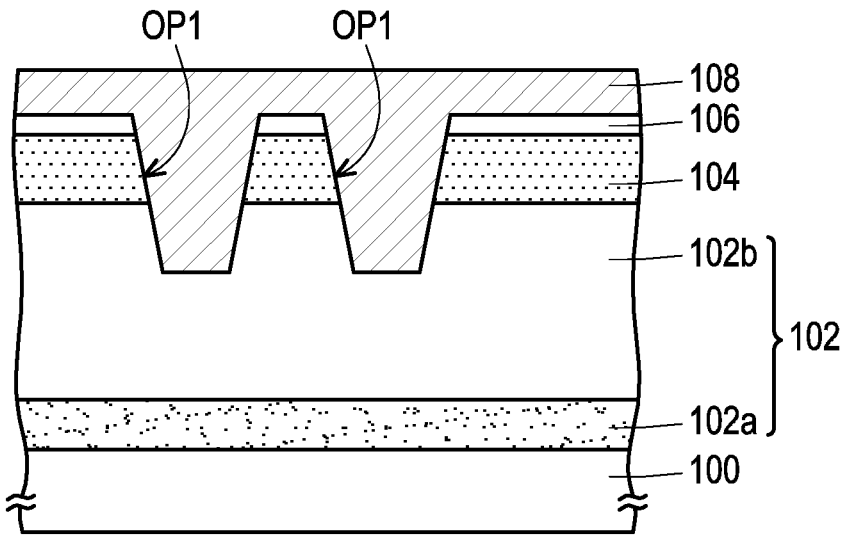

Referring to FIG. 1D, a bonding pad material layer 108 may be formed in the opening OP1. The material of the bonding pad material layer 108 may be metal such as copper (Cu). The method of forming the bonding pad material layer 108 is, for example, an electrochemical plating (ECP) method.

Figure 1E:
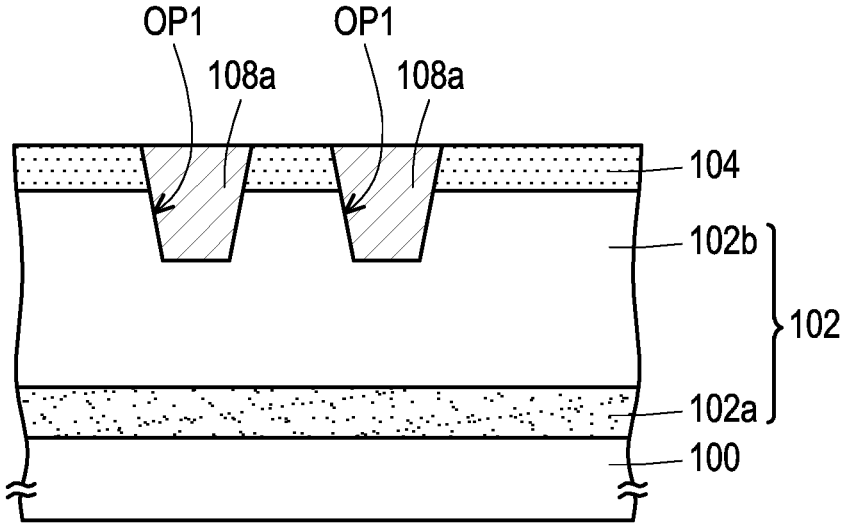

Referring to FIG. 1E, a portion of the bonding pad material layer 108 outside the opening OP1 may be removed and the passivation layer 106 may be removed. Therefore, a bonding pad 108a may be formed in the ODC bonding layer 104. In some embodiments, the bonding pad 108a may be further formed in the dielectric layer 102. The method of removing a portion of the bonding pad material layer 108 outside the opening OP1 and removing the passivation layer 106 is, for example, a CMP method. In some embodiments, in the process of removing a portion of the bonding pad material layer 108 outside the opening OP1 and removing the passivation layer 106, a portion of the ODC bonding layer 104 may be removed simultaneously. Then, a plasma treatment may be performed on the ODC bonding layer 104, thereby producing dangling bonds on the ODC bonding layer 104.

Figure 1F:
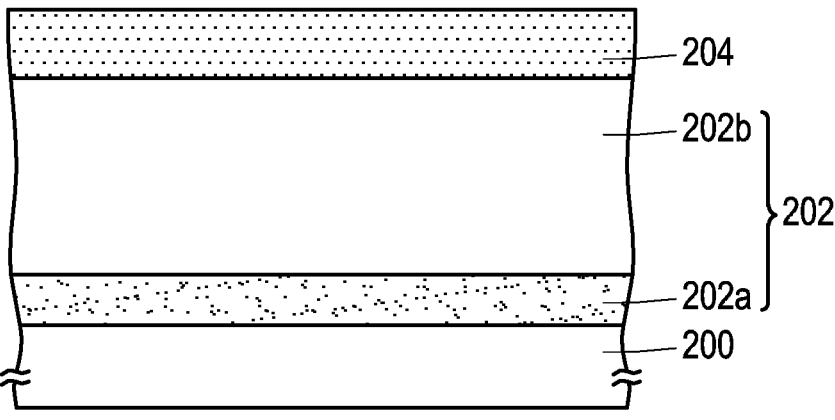

Referring to FIG. 1F, a substrate 200, a dielectric layer 202, and an ODC bonding layer 204 are provided. The substrate 200 may be a semiconductor substrate such as a silicon substrate. Furthermore, although not shown in FIG. 1F, the required semiconductor device (e.g., active device and/or passive device), another required dielectric layer and/or the required interconnect structure may be located on the substrate 200, and the description thereof is omitted here.

The dielectric layer 202 is located on the substrate 200. The dielectric layer 202 may be a single-layer structure or a multilayer structure. The material of the dielectric layer 202 is, for example, silicon oxide (SiO), silicon nitride (SiN), silicon carbonitride (SiCN), silicon oxynitride (SiON), or a combination thereof. The method of forming the dielectric layer 202 is, for example, a CVD method. In the present embodiment, the dielectric layer 202 may be a multilayer structure. For example, the dielectric layer 202 may include a dielectric layer 202*a* and a dielectric layer 202*b*, but the invention is not limited thereto. The dielectric layer 202*a* is located on the substrate 200. The material of the dielectric layer 202*a* is, for example, an NDC material (e.g., SiCN). The dielectric layer 202*b* is located on the dielectric layer 202*a*. The material of the dielectric layer 202*b* is, for example, silicon oxide (e.g., TEOS silicon oxide). In some embodiments, a CMP process may be performed on the dielectric layer 202*b*.

The ODC bonding layer 204 is located on the dielectric layer 202. The material of the ODC bonding layer 204 is, for example, silicon oxycarbide (SiCO). The method of forming the ODC bonding layer 204 is, for example, a CVD method.

Figure 1G:
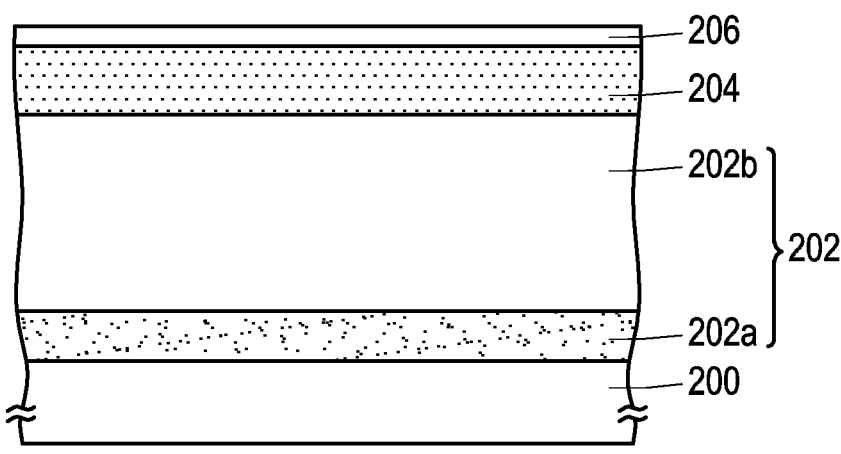

Referring to FIG. 1G, a passivation layer 206 may be formed on the ODC bonding layer 204. The material of the passivation layer 206 is, for example, silicon oxynitride (SiON). The method of forming passivation layer 206 is, for example, a CVD method.

Figure 1H:
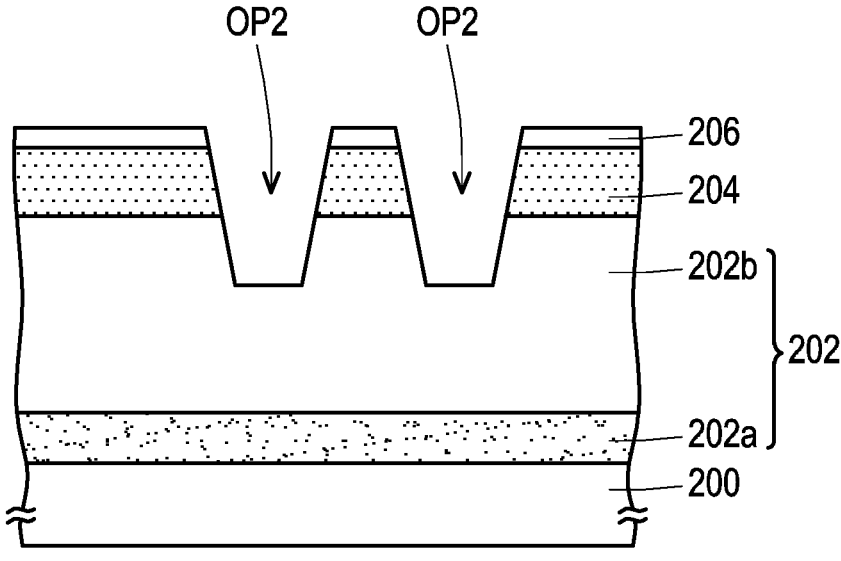

Referring to FIG. 1H, an opening OP2 may be formed in the passivation layer 206 and the ODC bonding layer 204. In some embodiments, the opening OP2 may be further formed in the dielectric layer 202. In some embodiments, the opening OP2 may be formed by patterning the passivation layer 206, the ODC bonding layer 204, and the dielectric layer 202 by a lithography process and an etching process.

Figure 1I:
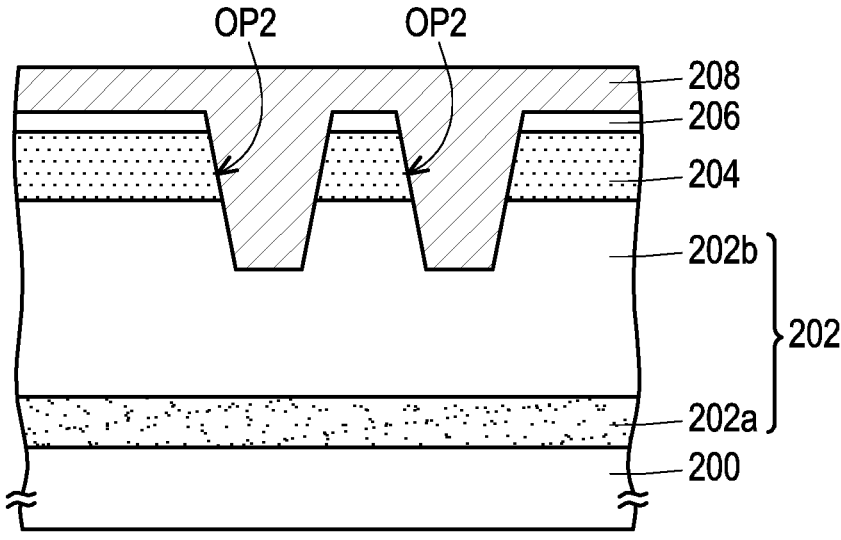

Referring to FIG. 1I, a bonding pad material layer 208 may be formed in the opening OP2. The material of the bonding pad material layer 208 may be metal such as copper (Cu). The method of forming the bonding pad material layer 208 is, for example, an electrochemical plating (ECP) method.

Figure 1J:
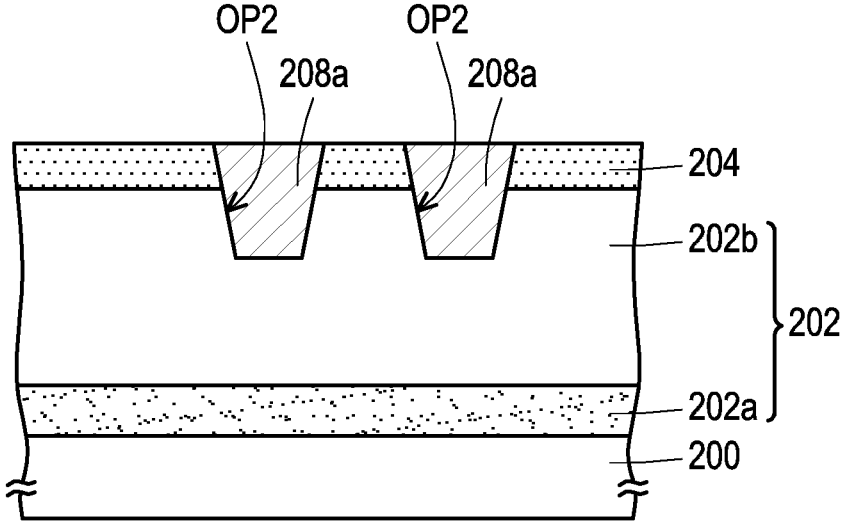

Referring to FIG. 1J, a portion of the bonding pad material layer 208 outside the opening OP2 may be removed and the passivation layer 206 may be removed. Therefore, a bonding pad 208*a* may be formed in the ODC bonding layer 204. In some embodiments, the bonding pad 208*a* may be further formed in the dielectric layer 202. The method of removing a portion of the bonding pad material layer 208 outside the opening OP2 and removing the passivation layer 206 is, for example, a CMP method. In some embodiments, in the process of removing a portion of the bonding pad material layer 208 outside the opening OP2 and removing the passivation layer 206, a portion of the ODC bonding layer 204 may be removed simultaneously. Then, a plasma treatment may be performed on the ODC bonding layer 204, thereby producing dangling bonds on the ODC bonding layer 204.

Figure 1K:
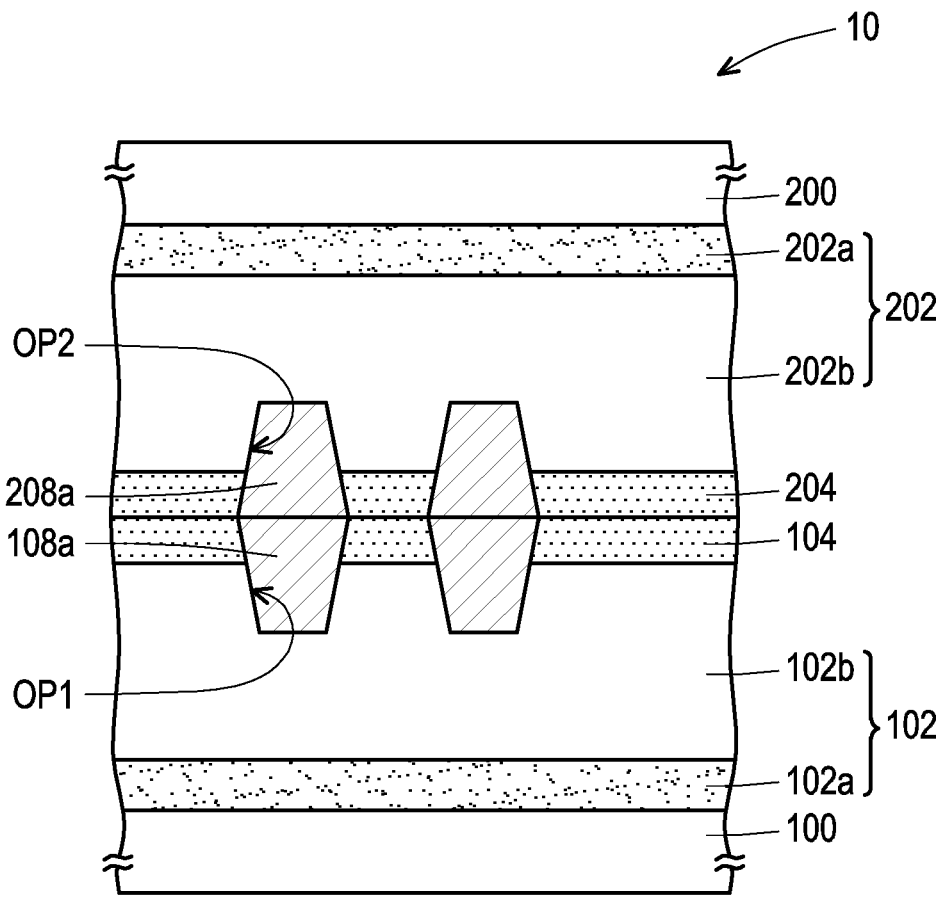

Referring to FIG. 1K, the ODC bonding layer 104 and the ODC bonding layer 204 are bonded. Furthermore, in the process of bonding the ODC bonding layer 104 and the ODC bonding layer 204, the dangling bonds on the ODC bonding layer 104 and the ODC bonding layer 204 can be converted to chemical bonds. Moreover, the bonding pad 108*a* and the bonding pad 208*a* may be bonded. The method of bonding the ODC bonding layer 104 and the ODC bonding layer 204 and bonding the bonding pad 108*a* and the bonding pad 208*a* is, for example, a hybrid bonding method.

Hereinafter, the semiconductor structure 10 of the present embodiment is described with reference to FIG. 1K. In the present embodiment, although the method of forming the semiconductor structure 10 is described by taking the above method as an example, the invention is not limited thereto.

Referring to FIG. 1K, a semiconductor structure 10 includes a substrate 100, a dielectric layer 102, an ODC bonding layer 104, a substrate 200, a dielectric layer 202, and an ODC bonding layer 204. The dielectric layer 102 is located on the substrate 100. The material of the dielectric layer 102 is, for example, silicon oxide (SiO), silicon nitride (SiN), silicon carbonitride (SiCN), silicon oxynitride (SiON), or a combination thereof. The ODC bonding layer 104 is located on the dielectric layer 102. The material of the ODC bonding layer 104 is, for example, silicon oxycarbide (SiCO). The dielectric layer 202 is located on the substrate 200. The material of the dielectric layer 202 is, for example, silicon oxide (SiO), silicon nitride (SiN), silicon carbonitride (SiCN), silicon oxynitride (SiON), or a combination thereof. The ODC bonding layer 204 is located on the dielectric layer 202. The material of the ODC bonding layer 204 is, for example, silicon oxycarbide (SiCO). The ODC bonding layer 104 and the ODC bonding layer 204 are bonded to each other.

Furthermore, the semiconductor structure 10 may further include a bonding pad 108*a* and a bonding pad 208*a*. The bonding pad 108*a* is located in the ODC bonding layer 104. In some embodiments, the bonding pad 108*a* may be further located in the dielectric layer 102. In some embodiments, the bonding pad 108*a* may be electrically connected to an interconnect structure (not shown) located in the dielectric layer 102. The bonding pad 208*a* is located in the ODC bonding layer 204. In some embodiments, the bonding pad 208*a* may be further located in the dielectric layer 202. In some embodiments, the bonding pad 208*a* may be electrically connected to an interconnect structure (not shown) located in the dielectric layer 202. The bonding pad 108*a* and the bonding pad 208*a* may be bonded to each other.

In some embodiments, the substrate 100 may be a substrate of a wafer or a substrate of a chip. In some embodiments, the substrate 200 may be a substrate of a wafer or a substrate of a chip. In some embodiments, the stacking manner of the substrate 100 and the substrate 200 may be a wafer-on-wafer (WoW) type, a chip-on-chip (CoC) type, or the like.

Moreover, the detailed content (e.g., the material, the arrangement, the forming method, the effect, and the like) of each component in the semiconductor structure 10 has been described in detail in the above embodiments and are not repeated herein.

Based on the above embodiments, in the semiconductor structure 10 and the manufacturing method thereof, the ODC bonding layer 104 and the ODC bonding layer 204 are bonded to each other. In addition, the ODC bonding layer 104 and the ODC bonding layer 204 have lower surface roughness. Furthermore, the ODC bonding layer 104 and the ODC bonding layer 204 can produce more dangling bonds than the NDC bonding layer. Moreover, the ODC bonding layer 104 and the ODC bonding layer 204 have a lower dielectric constant than the NDC bonding layer. Therefore, bonding the ODC bonding layer 104 and the ODC bonding layer 204 can produce higher bonding strength and can reduce RC delay.

In summary, in the semiconductor structure and the manufacturing method thereof of the aforementioned embodiments, the ODC bonding layer has lower surface roughness. Furthermore, the ODC bonding layer can produce more dangling bonds than the NDC bonding layer. Moreover, the ODC bonding layer have a lower dielectric constant than the NDC bonding layer. Therefore, the semiconductor structure and the manufacturing method thereof of the aforementioned embodiments can produce higher bonding strength and can reduce RC delay.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:

a first substrate;

a first dielectric layer located on the first substrate;

a first oxygen doped carbide (ODC) bonding layer located on the first dielectric layer;

a second substrate;

a second dielectric layer located on the second substrate;

a second ODC bonding layer located on the second dielectric layer;

a first bonding pad located in the first ODC bonding layer; and a second bonding pad located in the second ODC bonding layer, wherein the first ODC bonding layer and the second ODC bonding layer are bonded to each other, the first dielectric layer comprises a third dielectric layer and a fourth dielectric layer, the third dielectric layer is located on the substrate, the fourth dielectric layer is located on third dielectric layer, a material of the third dielectric layer is nitrogen doped carbide material, there is an opening in the first ODC bonding layer and the first dielectric layer, a bottommost surface of the opening is higher than a top surface of the third dielectric layer, there is an interface between the third dielectric layer and the fourth dielectric layer, an entire surface of the first bonding pad is aligned with an entire surface of the second bonding pad, and the first ODC bonding layer, the fourth dielectric layer, and the third dielectric layer are three consecutive layers.

2. The semiconductor structure according to claim 1, wherein a material of the first ODC bonding layer comprises silicon oxycarbide.

3. The semiconductor structure according to claim 1, wherein a material of the second ODC bonding layer comprises silicon oxycarbide.

4. The semiconductor structure according to claim 1, wherein the first bonding pad and the second bonding pad are bonded to each other.

5. The semiconductor structure according to claim 1, wherein the first bonding pad is further located in the first dielectric layer, and the second bonding pad is further located in the second dielectric layer.

6. The semiconductor structure according to claim 1, wherein a material of the first dielectric layer comprises silicon oxide, silicon nitride, silicon carbonitride, silicon oxynitride, or a combination thereof.

7. The semiconductor structure according to claim 1, wherein a material of the second dielectric layer comprises silicon oxide, silicon nitride, silicon carbonitride, silicon oxynitride, or a combination thereof.

8. The semiconductor structure according to claim 1, wherein the first substrate comprises a substrate of a wafer or a substrate of a chip.

9. The semiconductor structure according to claim 1, wherein the second substrate comprises a substrate of a wafer or a substrate of a chip.

* * * * *